(12) United States Patent
Sha

(10) Patent No.: US 6,377,646 B1
(45) Date of Patent: Apr. 23, 2002

(54) SPREAD SPECTRUM AT PHASE LOCK LOOP (PLL) FEEDBACK PATH

(75) Inventor: I-Teh Sha, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/120,536

(22) Filed: Jul. 21, 1998

Related U.S. Application Data

(60) Provisional application No. 60/053,259, filed on Jul. 21, 1997.

(51) Int. Cl.[7] ................................................. H03D 3/24
(52) U.S. Cl. ...................... 375/376; 375/130; 327/157
(58) Field of Search ............................... 375/376, 374, 375/130; 327/147, 146, 148, 151, 156, 157

(56) References Cited

U.S. PATENT DOCUMENTS

| 4,857,866 | A | * | 8/1989 | Tateishi | 331/1 A |
|---|---|---|---|---|---|
| 5,036,216 | A | * | 7/1991 | Hohmann et al. | 309/269 |
| 5,483,558 | A | * | 1/1996 | Leon et al. | 375/376 |
| 5,861,766 | A | * | 1/1999 | Baumer et al. | 327/157 |

\* cited by examiner

Primary Examiner—Temesghen Ghebretinsae
(74) Attorney, Agent, or Firm—Christopher P. Maiorana, P.C.

(57) ABSTRACT

A plurality of four bit modulation read only memory (ROM) codes are generated with a PLL feedback divider. The output of a single phase lock loop is modulated to spread the bandwidth of a synthesized clock signal. By spreading the bandwidth, the amplitude of the synthesized clock signal is decreased with respect to its fundamental and its harmonics. As a result of reducing the peak amplitudes, the radiated electromagnetic emission level is significantly lower. Input phase lock loop system data is received as to selected phase lock loop characteristics. A continuous FBD is selected, and a bandwidth and system stability calculation is performed. A state variable system is determined and a numerical model for programming by finite differences is developed. A best path is determined to produce output data and ROM code by a least squares error method.

20 Claims, 10 Drawing Sheets

SPREAD SPECTRUM AT PHASE LOCK LOOP (PLL) FEEDBACK PATH

CROSS-REFERENCE

This patent application is related to Provisional Patent Application Serial No. 60/053,259 filed Jul. 21, 1997 under the title Spread Spectrum At Phase Lock Loop (PLL) Feedback Path Method and System, which is hereby expressly referenced, incorporated herein in its entirety, and claimed hereby for purposes of making a priority claim.

TECHNICAL FIELD

The present application relates to spread spectrum at phase lock loop (PLL) feedback path methods and systems and more particularly to spread spectrum digital clock circuits having reduced electromagnetic interference (EMI) emissions.

BACKGROUND

Many digital circuits require clock signals for synchronization. Such digital circuits include microprocessors, which are operating at higher and higher frequencies, making them increasingly susceptible to EMI. One known solution adds weight, complexity, and cost by reducing EMI with filters, shielded boxes, or ferrite elements.

U.S. Pat. No. 5,488,627 discloses a spread spectrum (SS) clock generator which reduces the spectral amplitude of EMI components over a substantial bandwidth. According to this patent, a phase locked loop (PLL) is used to multiply the frequency of a selected low frequency crystal. The PLL is used to force the frequency of a voltage controlled oscillator (VCO) to change until a divided output signal and a divided reference signal match the phase detector input. However, the clock circuit has a noisy envelope.

Accordingly, it is desirable to develop a clock signal which operates at a reduced noise level and reduced EMI for applications including but not limited to computers, automotive devices and systems, fax/modems, copiers, scanners, printers, and set-top boxes, for example, without requiring costly shielding.

SUMMARY OF THE INVENTION

According to the present invention, a plurality of four bit modulation read only memory (ROM) codes are generated with a phase lock loop (PLL) feedback divider. The output of a single phase lock loop is modulated to spread the bandwidth of a synthesized clock signal according to the present invention. By spreading the bandwidth of the synthesized clock signal, the peak amplitude of the synthesized clock signal is decreased with respect to its fundamental frequency and its harmonics. As a result of reducing the peak amplitude of the synthesized clock signal, the radiated electromagnetic emission level is significantly lower than in the case of a typical narrow band signal produced by conventional frequency generators. Thus, spread spectrum clock generation according to the present invention is effective for lowering a signal's amplitude by increasing its bandwidth. According to a method of the present invention, input phase lock loop system data is received as to selected phase lock loop characteristics. Next, a continuous feedback divider is used, and a bandwidth and system stability calculation is performed. Then, according to the present invention, a state variable system is determined and a numerical model for programming by finite differences is conducted. Next, an initial state setup is developed. Then, a next possible state calculation is performed. A best path is determined to produce output data and ROM code by a least squares error method.

A spread spectrum clock generator according to the present invention enables reduction of electromagnetic emission according to one embodiment by as much as 12 dB. An actual attenuation of emissions is a function of frequency according to the present invention. According to one embodiment of the present invention, emission attenuation is greatest at the higher frequencies of the attenuation range. With spread spectrum clock generation according to the present invention, board layout shielding can be reduced or eliminated for selected printed circuit boards. According to the present invention shielding requirements are reduced or eliminated, resulting in lower costs and lighter weight products.

BRIEF DESCRIPTION OF THE DRAWINGS

FIG. 4C is a graph of a frequency characteristic of a spread spectrum clock signal with modulation generated by the software at a selected modulation frequency, showing a decrease in jitter conditions despite modulation, according to the present invention;

DETAILED DESCRIPTION OF THE PREFERRED EMBODIMENT

Figure 1:
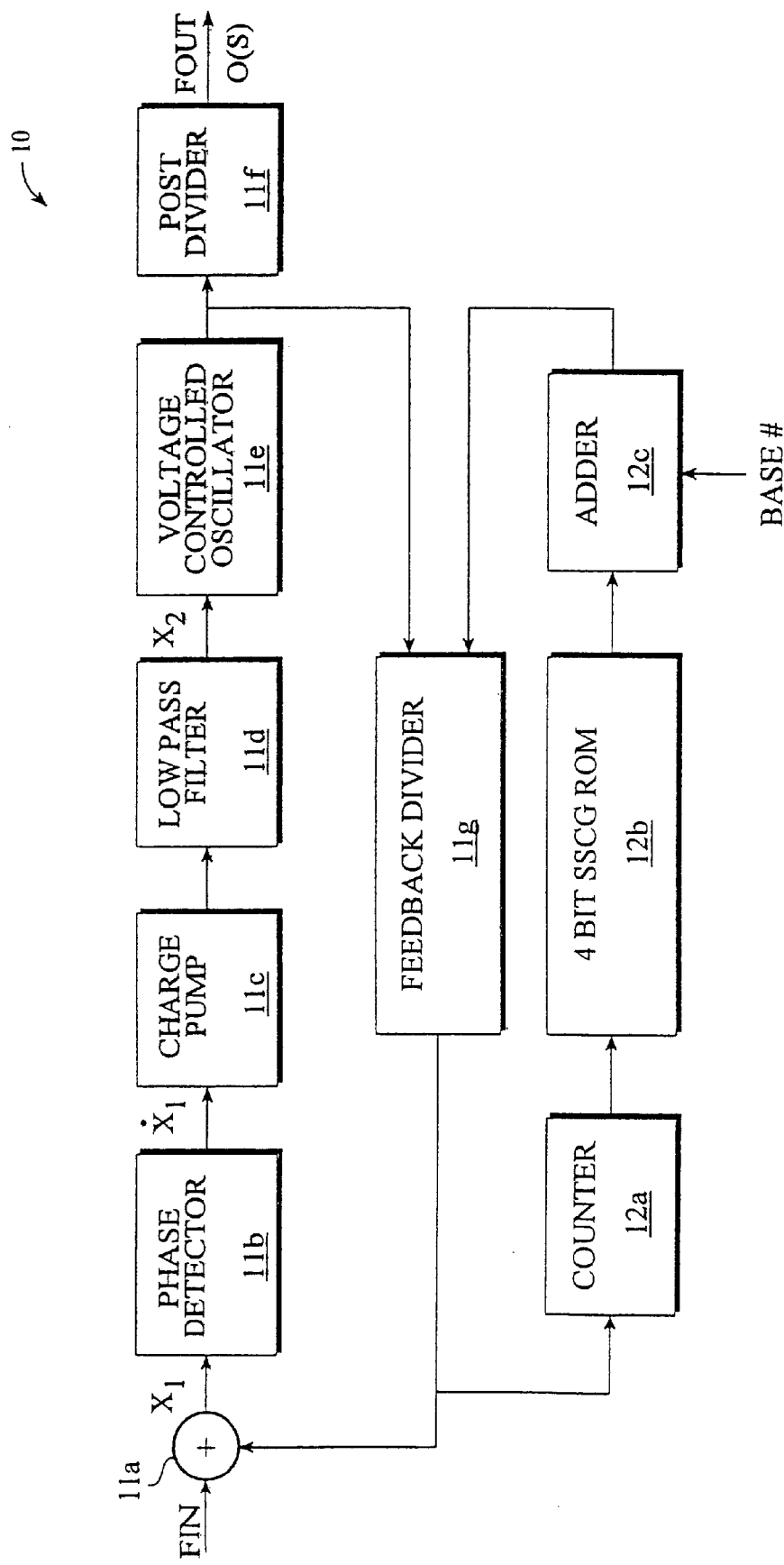
FIG. 1 is a block diagram of a phase lock loop circuit according to the present invention, including four bit modulation circuitry in the feedback loop of the phase lock loop.

FIG. 1 is a block diagram of a phase lock loop circuit according to the present invention, including four bit modulation circuitry in the feedback loop of the phase lock loop.

In particular, FIG. 1 shows a phase lock loop circuit 10 including a summation element 11a, a phase detector (PD) 11b, a charge pump (CP) 11c, a low pass filter (LPF) 11d, a voltage controlled oscillator (VCO) 11e, a post divider (POST) 11f, a feedback divider 11g, and a spread spectrum circuit 12 according to the present invention. A spread spectrum circuit 12 according to the present invention includes a counter 12a, a four bit spread spectrum clock generator (SSCG) read only memory (ROM) 12b and an adder 12c. A summation element 11a receives an input frequency signal FIN and a negative signal to produce an input signal which is provided to phase detector 11b. The output of phase detector is connected to charge pump 11c, and the output of charge pump 11c is provided to low pass filter 11b. The output of low pass filter 11b is provided to voltage controlled oscillator 11e which in turn is provided to post divider 11f to produce a frequency output signal fout. The output of voltage controlled oscillator 11e is provided to feedback divider 11g and the output of feedback divider 11g is provided to summation element 11a. Spread spectrum circuit 12 receives the output of feedback divider 11g as the input of counter 12a. According to one embodiment of the present invention, counter 12a reads frequency pulse signals at the output of feedback divider 11g and is programmably resettable to cycle through predetermined count ranges within the maximum count range of counter 12a. The output of counter 12a is provided to spread spectrum clock generator ROM 12b, and the output of spread spectrum clock generator ROM 12b is provided to adder 12c. The output of adder 12c is in turn provided to feedback divider 11g.

Figure 2:
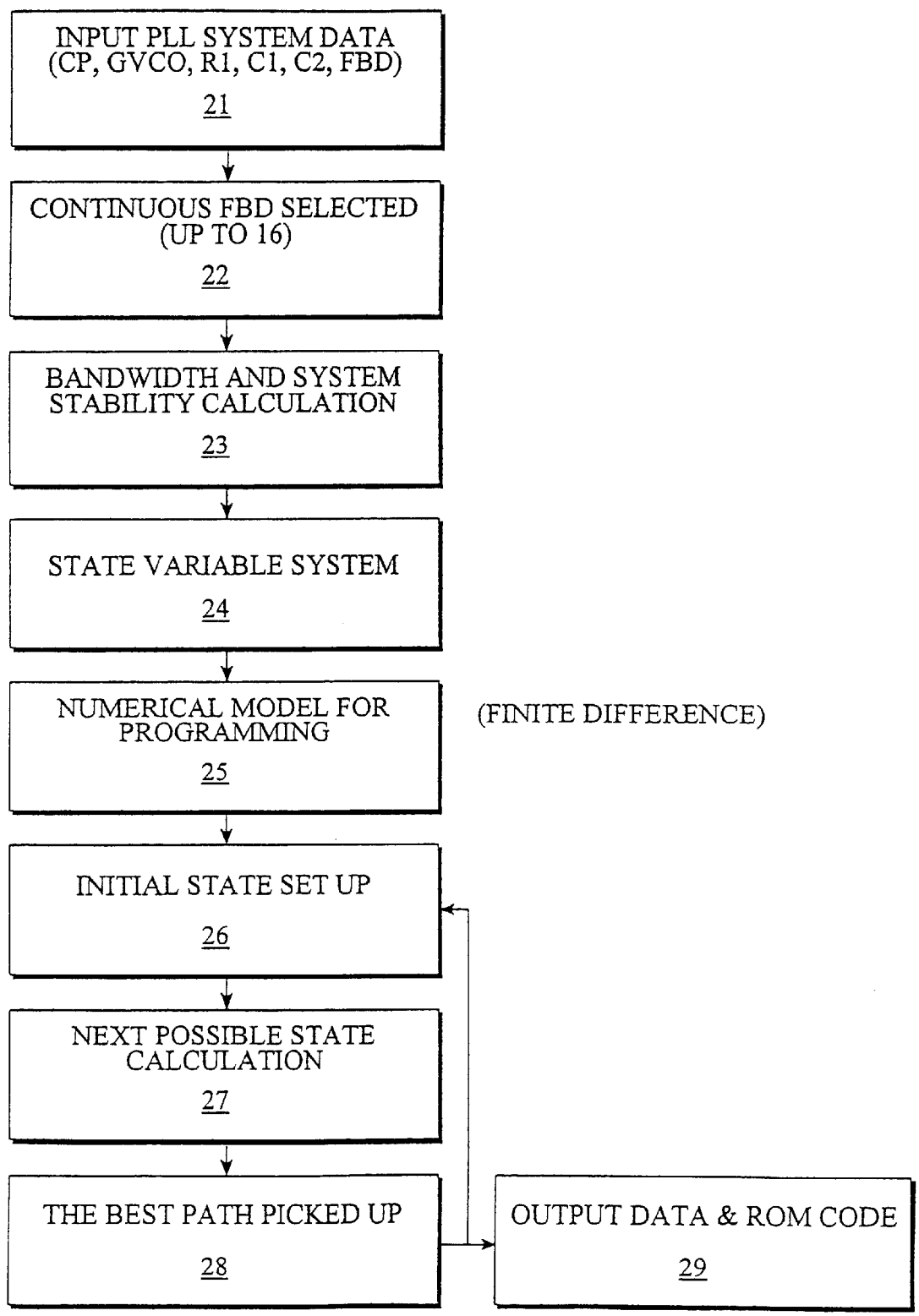
FIG. 2 is a flow chart of the spread spectrum clock generator method of the present invention.

FIG. 2 is a flow chart of the spread spectrum clock generator method of the present invention. In particular, according to a method of the present invention 20, input phase lock loop system data is received 21 as to selected phase lock loop characteristics including for example the charge characteristic of charge pump 11c (CP), the gain of the voltage controlled oscillator 11e (GVCO), the resistance (R1) and first and second capacitances (C1 and C2) of the low pass filter 11d, and the characteristic function of the feedback divider (FBD). According to one embodiment of the present invention, the low pass filter resistor R1 is connected in series to ground of a selected one of capacitors C1 and C2, which is an order of magnitude larger than the other one of the capacitors. Next according to one embodiment of the present invention, a continuous feedback divider is selected 22, and a bandwidth and system stability calculation is performed 23. Then, according to the present invention, a state variable system is determined 24, according to the state variable formula in Appendix B with reference to the input PLL system data defined above. A numerical model for programming by finite differences is conducted 25, according to the finite difference formula in Appendix B. Next, an initial state setup including initial state value is developed 26 based upon a first empirical value in a Hershey-Kiss pattern as shown for example in FIG. 4A. Then, a next possible state calculation is performed 27 to determine a value on the pattern which follows the initial value. A best path is determined 28 to produce 29 output data and ROM code by a least squares error method, according to the least square -error formula in Appendix B.

Figure 3A:
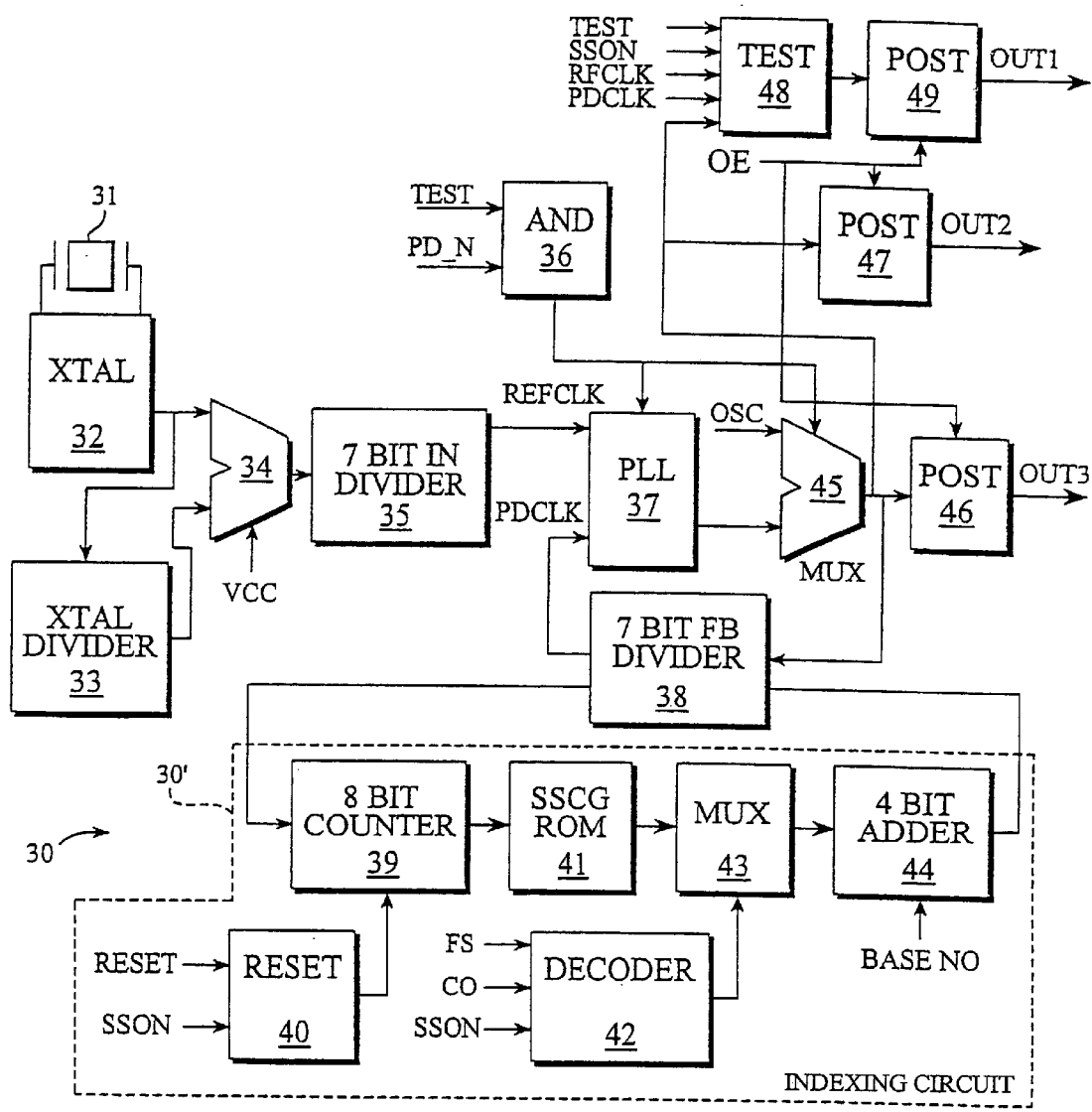
FIG. 3A is a block diagram of selected portions of the phase lock loop circuit according to the present invention.

FIG. 3A is a block diagram of selected portions of the phase lock loop circuit 30 according to the present invention. In particular, FIG. 3A includes a phase lock loop circuit 30 which has a crystal 31, a crystal oscillator circuit 32, a crystal divider circuit 33, a multiplexor 34, a seven bit input divider circuit 35, an AND logical element 36, a phase lock loop 37, a seven bit FB divider 38, an eight bit counter 39, a spread spectrum clock generator ROM 41, a decoder 42, a multiplexor 43, a four bit adder circuit 44, a multiplexor 45, a first post circuit 46, a second post circuit 47, a test circuit 48 and a third post circuit 49. Crystal 31 is connected to a crystal oscillator circuit 32. The output of crystal oscillator circuit 32 is connected to crystal divider circuit 33 and multiplexor 34. The output of crystal divider circuit 33 is connected to the input of multiplexor 34. Multiplexor 34 is provided with a voltage VCC. The output of multiplexor 34 is provided to seven bit in divider circuit 35 which produces a reference clock signal refclk. AND circuit 36 receives as inputs a TEST signal and a second signal PD-N, and its output is connected to phase lock loop 37 and as a control input to multiplexor 45. Multiplexor 45 receives oscillator signal OSC and the output of phase lock loop 37 as inputs. The output of multiplexor 45 is connected to first POST circuit 46, second POST circuit 47, TEST circuit 48 and to seven bit FB divider circuit 38. One output of seven bit FB divider circuit 38 is output signal pdclk which is provided to phase lock loop 37. A second output of seven bit at the divider circuit 38 is provided to eight bit counter circuit 39. The output of eight bit counter circuit 39 is provided as an input to spread spectrum clock generator ROM 41. The output of spread spectrum clock generator ROM 41 is connected to multiplexor 43, and the output of multiplexor 43 is in turn connected to four bit adder 44. Four bit adder 44 receives additionally an input base number and its output is connected to seven bit feedback divider 38. Eight bit counter 39 is resettable with a reset signal from reset circuit 40, which is subject to a reset signal RESET and a second signal SSON. Multiplexor 43 is settable by decoder 42 in response to predetermined signals FS, CO, and SSON. TEST circuit 48 is controlled by signals TEST, SSON, rfclk, and pdclk. The output of TEST circuit 48 is connected to third POST circuit 49, first, second, and third POST circuits respectively 46, 47, and 49, are subject to input signal OE. Respective first, second, and third POST circuits 46, 47, and 49 respectively produce first, second, and third output signals OUT3, and OUT2, and OUT1. In summary, a phase lock loop is used according to the present invention to multiply the frequency of a low-cost, low frequency crystal up to a desired clock frequency. An on-chip crystal driver causes the crystal to oscillate at its fundamental frequency. The resulting reference signal is divided by N and fed to the phase detector. The phase lock loop will force the frequency of the VCO output signal to change until the divided output signal and the divided reference signal match at the phase detector input. According to the present invention, in the spread spectrum clock generator, a modulating waveform is superimposed with respect to the VCO, causing the VCO output to be slowly swept across a predetermined frequency band. According to one embodiment of the present invention, the output of the VCO is fed back to a feedback divider 11g; according to another embodiment of the present invention, the input of the VCO is fed back to the feedback divider. The output of the feedback divider is provided to a summation node at the input side of phase detector 11b. Feedback divider 11g is further subject to a secondary feedback loop (indexing circuit) 30' which adjusts a value in the feedback divider 11g to cause the slow sweeping action between the bounds of a predetermined frequency band. According to one embodiment of the present invention, the modulating frequency is on the order of 1000 times slower than the fundamental clock frequency. Accordingly, the spread spectrum process according to the present invention has an insignificant impact upon system performance, except with respect to reduced noise, EMI, and jitter.

Figure 3B:
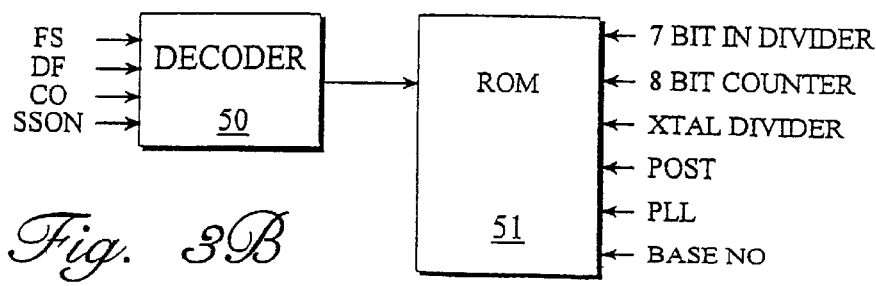
FIG. 3B is a block diagram of a decoder and read only memory according to the present invention, effective for producing signals for the phase lock loop circuit according to the present invention.

FIG. 3B is a block diagram of a decoder 50 and read only memory (ROM) 51 according to the present invention, effective for producing signals for the phase lock loop circuit according to the present invention. In particular, the output of decoder 50 is connected to the input of ROM 51. Decoder 50 receives first, second, third, and fourth input signals respectively FS, DF, CO, and SSON. ROM 51 produces respective output signals SEVEN BIT IN DIVIDER, EIGHT BIT COUNTER, XTAL DIVIDER, POST, PLL, and BASE NO.

Figure 4A:
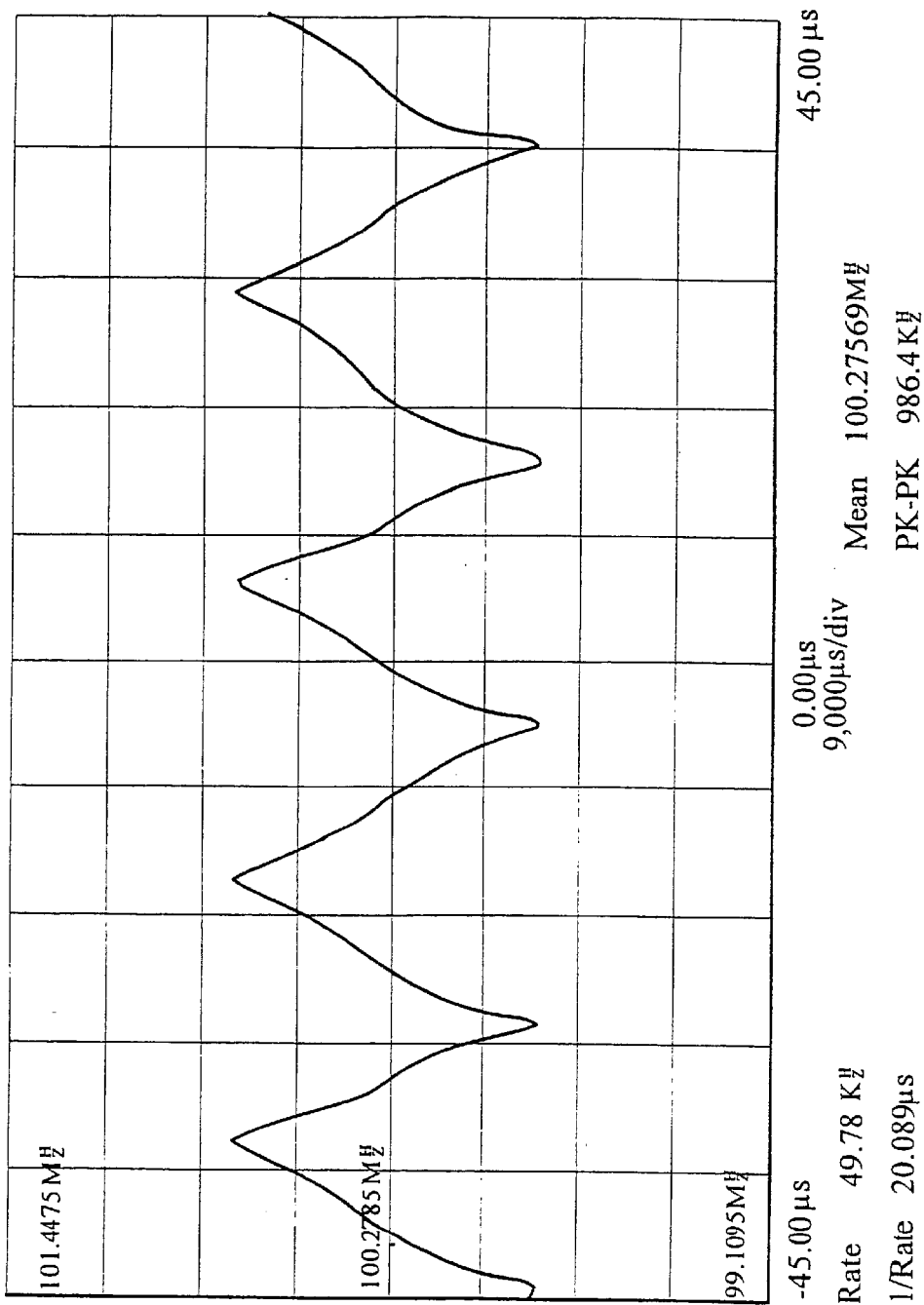
FIG. 4A is a graph of a frequency characteristic of a spread spectrum clock signal with modulation generated by the software at a selected modulation frequency, resulting in the clock frequency being modified regularly within predetermined bounds, according to the present invention.

FIG. 4A is a graph of a frequency characteristic of a spread spectrum clock signal with modulation generated by the software at a selected modulation frequency, resulting in the clock frequency being modified regularly within predetermined bounds, according to the present invention.

Figure 4B:
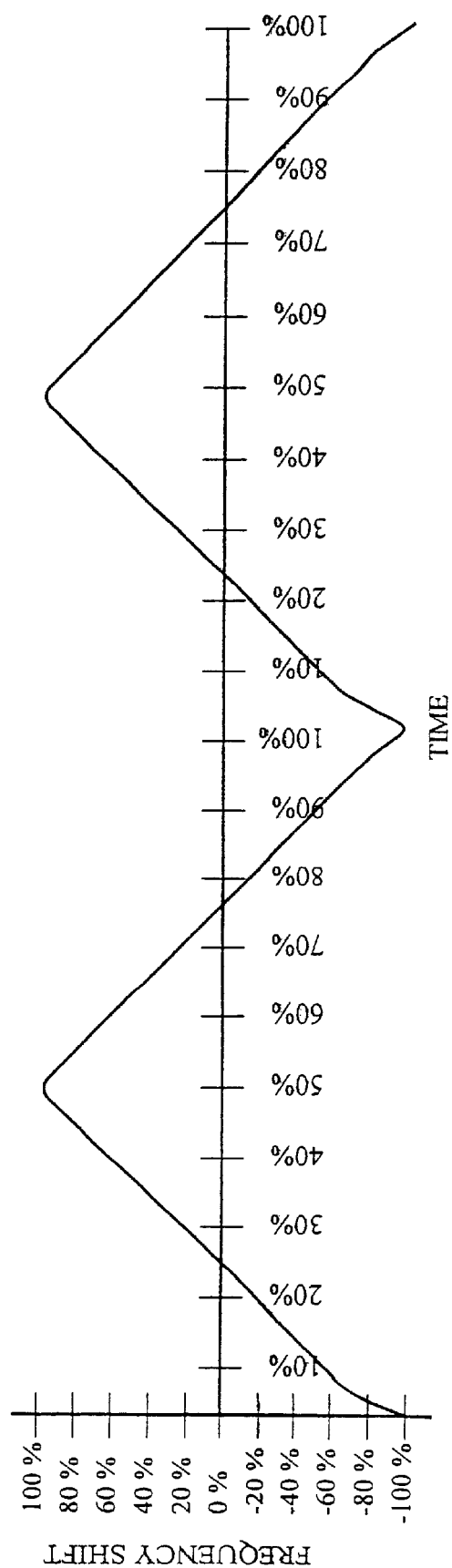
FIG. 4B is a graph of an ideal frequency characteristic of a spread spectrum clock signal with modulation at a selected modulation frequency, resulting in the clock frequency being modified regularly within predetermined bounds, according to the present invention.
Figure 46:
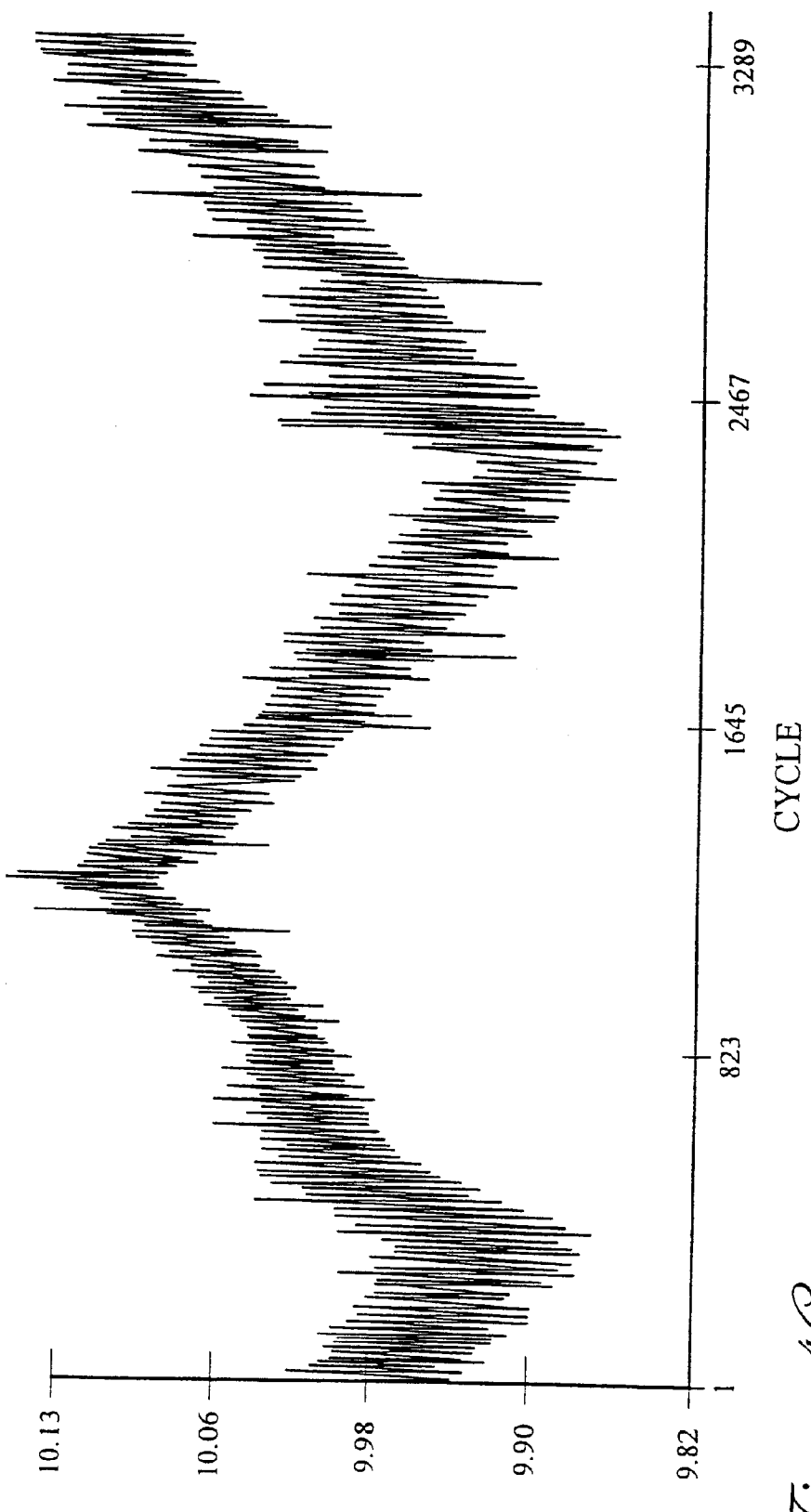

FIG. 4B is a graph of an ideal frequency characteristic of a spread spectrum clock signal with modulation at a selected modulation frequency, resulting in the clock frequency being modified regularly within predetermined bounds, according to the present invention. The shape of the modulating waveform is effective to reduction of EMI according to the present invention. The period of the modulation is shown as a percentage of the period length along the x-axis. The amount that the frequency is varied is shown along the y-axis also shown as a percentage of the total frequency spread.

FIG. 4C is a graph of a frequency characteristic of a spread spectrum clock signal with modulation generated by the software at a selected modulation frequency, showing a decrease in jitter conditions despite modulation, according to the present invention.

Figure 4D:
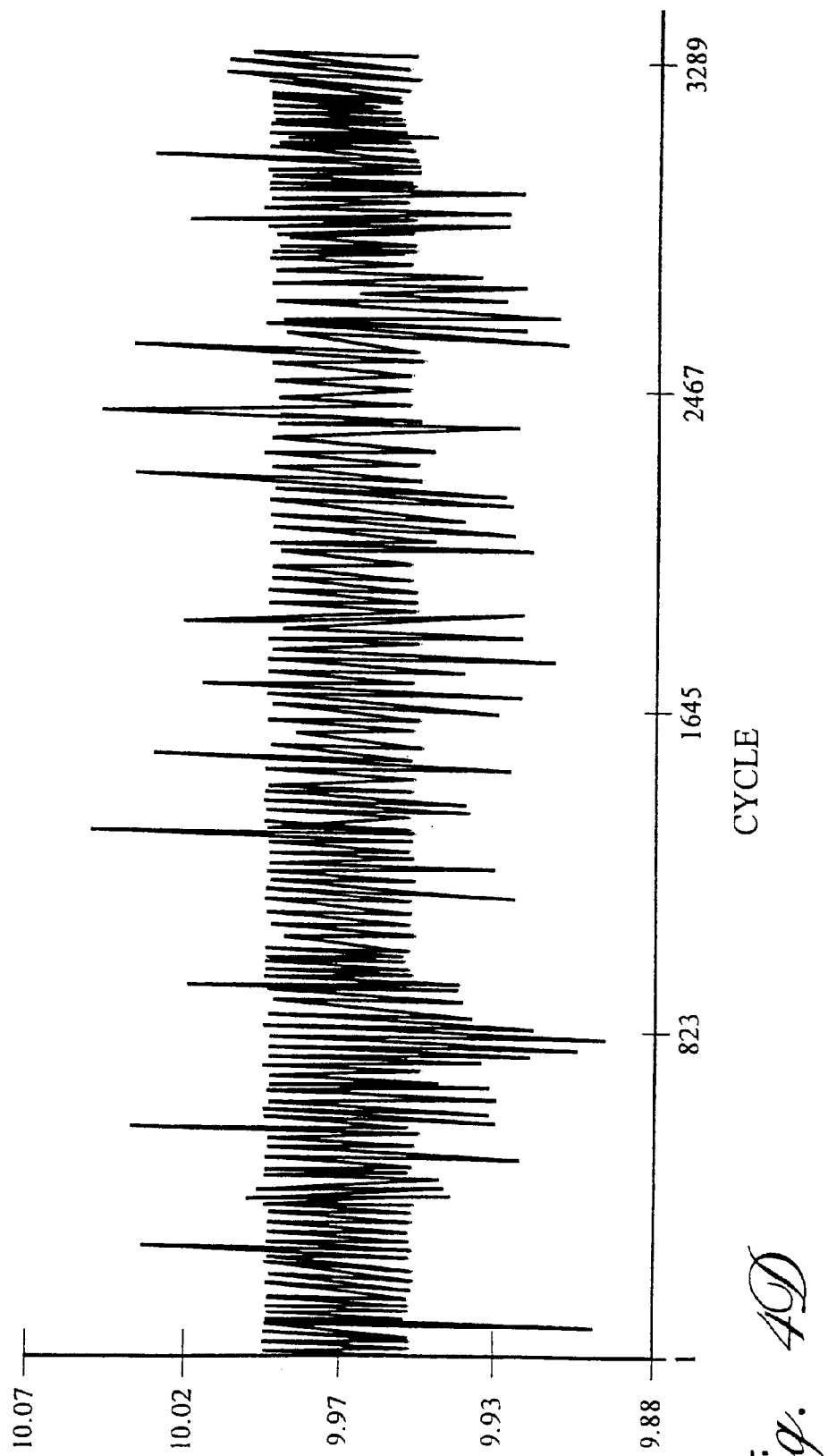
FIG. 4D is a graph of a frequency characteristic of an unmodulated spread spectrum clock signal without the modulation software being activated at a selected modulation frequency, showing substantial jitter.

FIG. 4D is a graph of a frequency characteristic of an unmodulated spread spectrum clock signal without the modulation software being activated at a selected modulation frequency, showing substantial jitter.

Figure 5A:
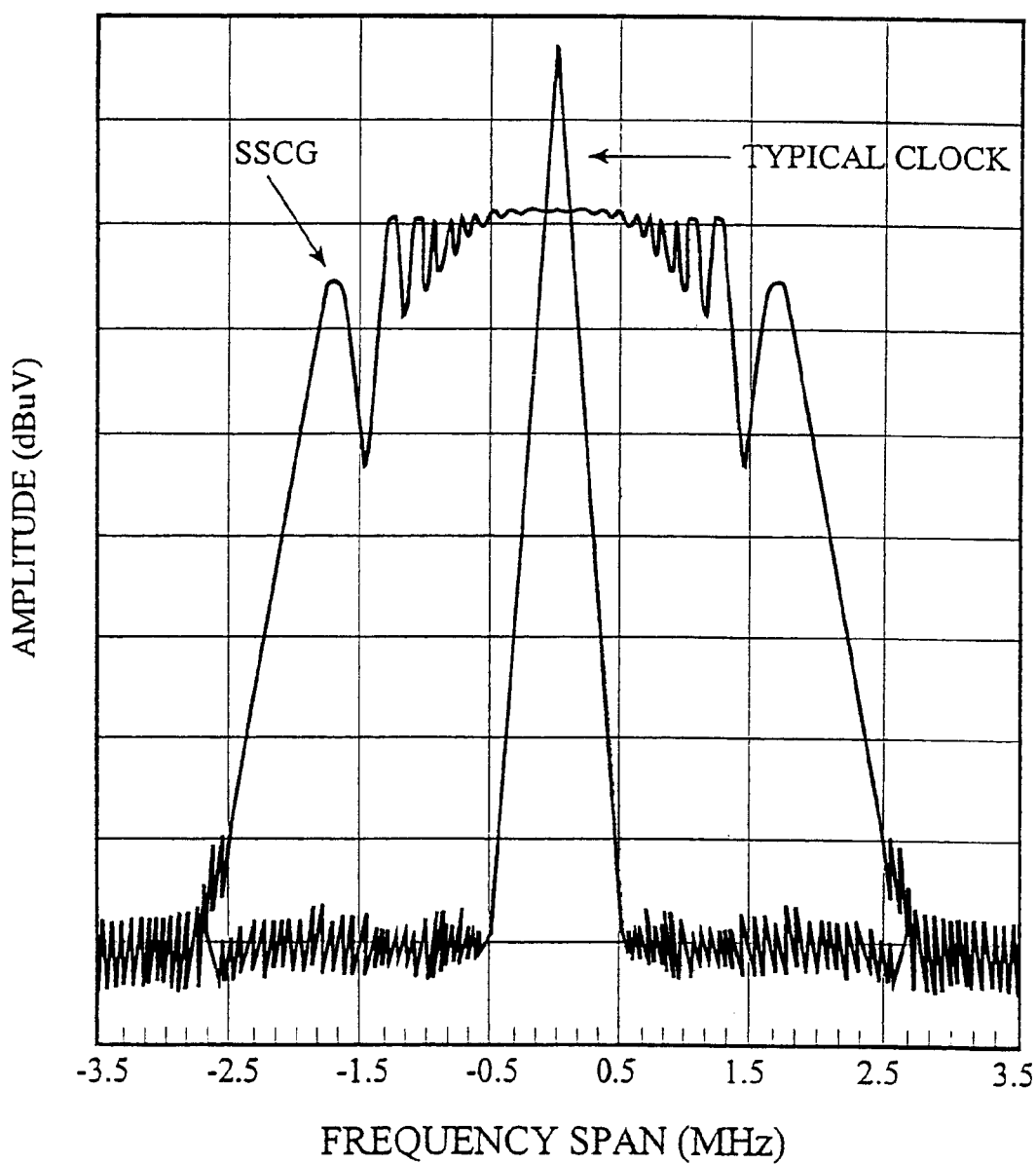
FIG. 5A is a graph of ideal typical clock signal frequence distribution compared to an ideal spread spectrum clock signal frequency distribution according to the present invention.

FIG. 5A is a graph of ideal typical clock signal frequency distribution compared to an ideal spread spectrum clock signal frequency distribution according to the present invention. The ideal typical clock signal frequency distribution has a relatively narrow frequency span having a high peak amplitude which is characteristic of a spike. Such a spike can make systems fail quasi-peak EMI testing. The FCC and other regulatory agencies test for peak emissions. The ideal spread spectrum clock signal frequency distribution according to the present invention has a substantially expanded frequency span accompanied by a reduced peak amplitude. The expanded frequency span provides a much lower peak energy (on the order of at least 8 dB) because the energy is spread over a much wider bandwidth. EMI reduction according to the present invention depends upon the shape, modulation percentage and the frequency of the modulating waveform. The shape and the frequency of the modulating waveform are fixed according to one embodiment of the present invention. The modulation percentage according to the present invention is variable. Various spreading percentages for different input frequency ranges can be selected according to the present invention. For example, an input reference frequency between 18 and 26 MHz produces an output frequency at twice the reference frequency with a spread of plus or minus 2.5%. EMI reduction increases as a function of the spreading percentage, according to the present invention.

Figure 5B:
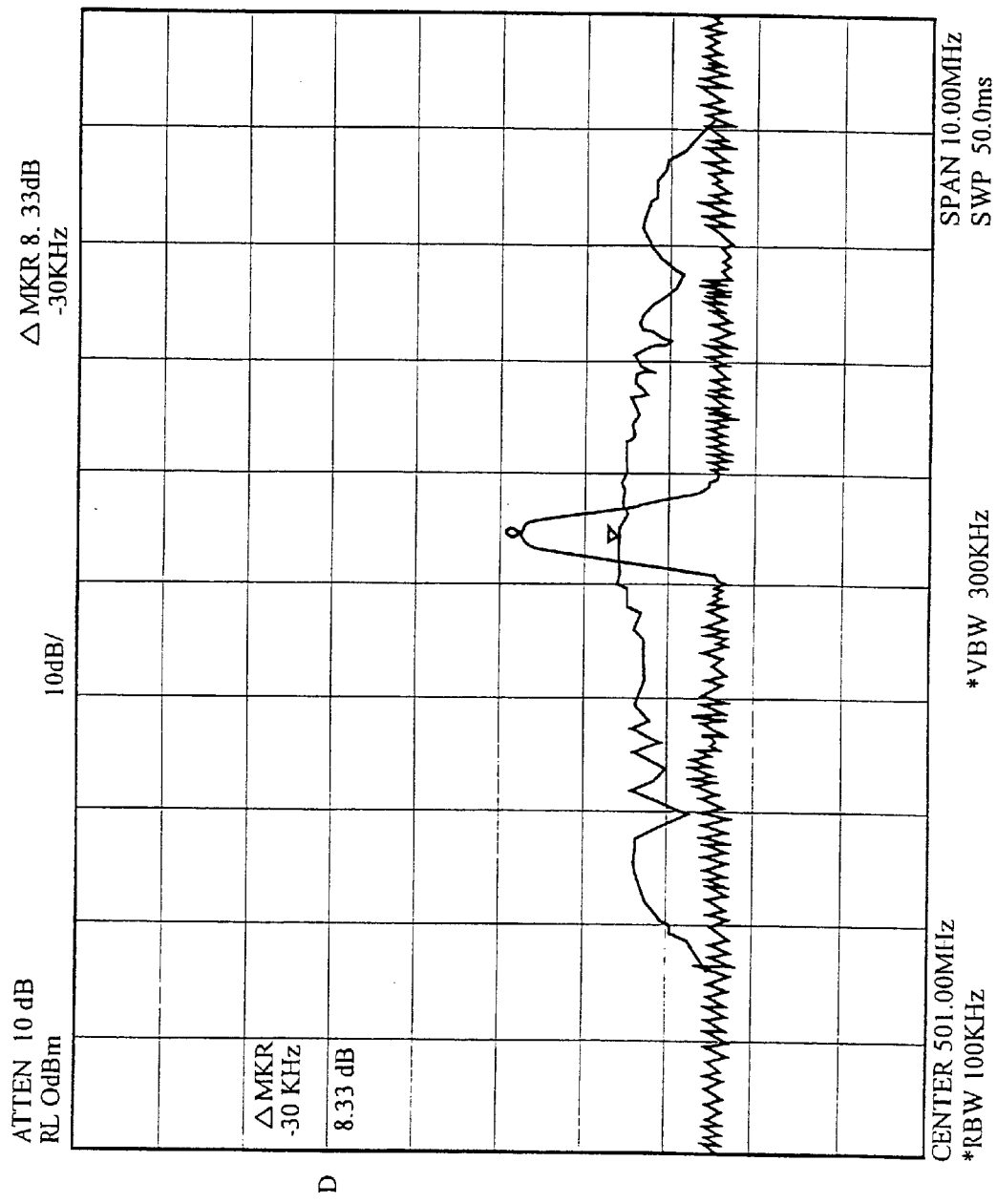
FIG. 5B is a graph of an actual typical clock signal frequence distribution compared to an actual spread spectrum clock signal frequency distribution according to the present invention.

FIG. 5B is a graph of an actual typical clock signal frequence distribution compared to an actual spread spectrum clock signal frequency distribution according to the present invention.

Figure 6:
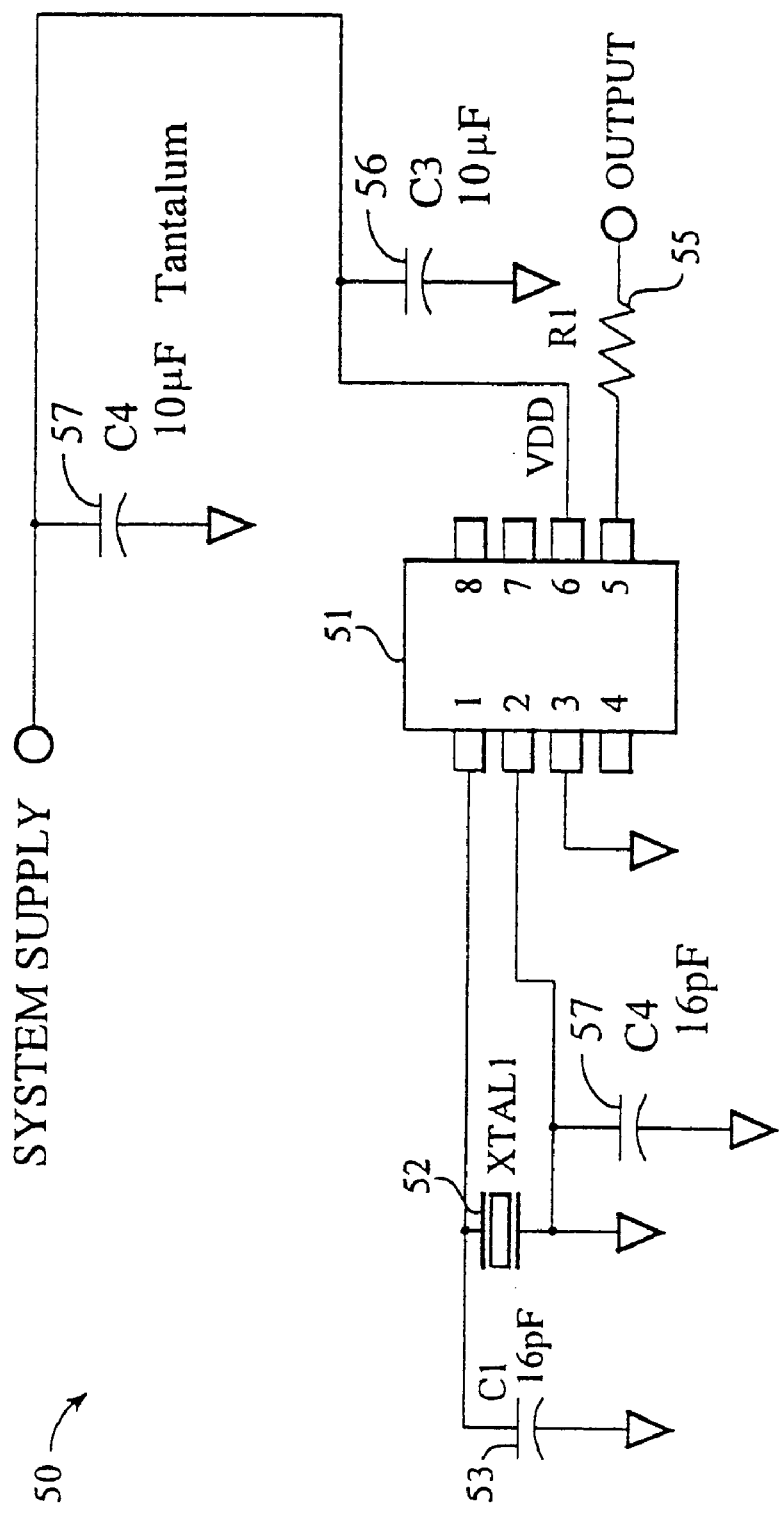
FIG. 6 is a block diagram of a spread spectrum clock generator according to the present invention

FIG. 6 is a block diagram of a spread spectrum clock generator system 50 according to circuit configuration of the present invention. In particular, spread spectrum clock generator system 50 includes a clock generator circuit 51 according to the present invention, which has pins 1–8. The spread spectrum clock generator system 50 further includes a crystal frequency source 52 connected between crystal input and crystal output pins 1 and 2, first and second capacitors respectively 53 and 54 connected for enabling crystal frequency source 52 to oscillate, output load resistor 55 connected to pin 5, and DC coupling capacitors 56 and 57 connected to pin 6 to provide a system supply voltage VDD at for example 3.3 or 5 volts. Capacitors 53 and 54 are connected to opposite sides of crystal frequency source 52. Pin 3 is connected to ground. DC coupling capacitors 56 and 57 are used to reduce phase jitter and electromagnetic interference (EMI). According to the present invention, capacitor 56 is connected in the immediate proximity of pin 6, to prevent trace inductance from negating its decoupling capability. According to one embodiment of the present invention, capacitor 57 is fabricated with tantalum, and a ferrite bead is used to effect the VDD connection with pin 6.

Appendix A provides an additional detailed description of the present invention.

Appendix B provides formulas used in a method according to an embodiment of the present invention.

Appendix C is Fortran software code for determining memory values in a read only memory to establish a spread spectrum waveform according to one embodiment of the present invention.

```
IMPLICIT DOUBLEPRECISION (A–H, O–Z)
DIMENSION AM (3.3), X (16.3), X1(3), U(3) XJ(0.16), NDIV
    FBD (0.16), ATM(16) TIME(16), ERR(16), XMAX(16)
OPEN (9.FILE = 'C:\F7723\BIN\DATA1.TXT')
OPEN (10.FILE = 'C:\F7723\BIN\DATA2.TXT')
OPEN (12.FILE = 'C:\F7723\BIN\DATA3.TXT')
FMAX = 1.D−1/(1D0/48..2D6+250.D−12)
FMOD = FMAX/150.D0
7MOD = 1.D0/FMOD
DEV = 1.875 D−2'
FSAMPLE = 133.82 D8
FCENTER = FMAX/(1.D0+DEV)
FMIN = FCENTER*(1.D0−DEV)
TSAMP = 1.D0/FSAMPLE
VOO = 133.32 D6
WEIGH = 5.5 D−1
GVCO = 5.5 D7
UGPD = 3.9394 D−6
DGPD = 3.9073 D−6
C1 = 36.75 D−12
A2 = 40.177 D3
C2 = 382.092 D−12
X(1.1) = 0.O0
X(1.2) = 1.78 D0
X(1.3) = 1.78 D0
DO 10I1 = 1.16
NDIV(I1) = INT(FSAMPLE/FMAX)−8+I1
FBD(I1) = NDIV(I1)*1.D0
AMT((I1) = GVCO/FBD(I1)
TIME(I1) = 0.D0
IF(I1.GE.2) THEN
DO 20 J1 = 1.3
X(I1.J2) = X(1.J2)
CONTINUE
ENDIF
CONTINUE
AM(1.1) = 0.D0
AM(1.3) = 0.D0
AM(2.2) = −1.D0/(C1*R2)
AM(2.3) = 1.D0/(C1*R2)
```

-continued

```
    AM(3.1) = 0.D0
    AM(3.2) = 1.D0/(C2*R2)
    AM(3.3) = -1.D0/(C2*R2)
    U(1) = 14. = 18D6/3.D0
    U(2) = 0.D0
    U(3) = 0.D0
    FBDM = 28.D0
    FSAMPLE = X(1,2)*GVCO
    TSAMP = 1.D0/FSAMPLE
    ICYCLE = 10*TMOD*U(1)
    WRITE(12.35)
    FORMAT (2x. 'NO'. 9x 'TIME'. 7x.' ROMJ CODE'. 7x. 'MODU
        PRO' 2x. 'ERROR'. 8x. 'JITTER')
    DO 45 I = 1.8
    ERR(I) = 0.D0
    CONTINUE
    DO 25 I = 1.ICYCLE
    DO 30 I3 = 1.16
    NDIV1 = NDIV(I3)
    AM(1.2) = AMT(I3)
    TIME1 = TIME(I3)
    XJS = 0.D0
    DO 40 J4 = 1.3
    X1(J4) = X (I3.J4)
    CONTINUE
    IF(x1(2)*GVCO/NDIV1.LE U(11) THEN
    AM(2.1) = UGID/C1
ELSE
    AM(2.1) = DG1D/C1
ENDIF
    CALL XMODEL (X1. XJS. TIME1.FBDM.GVCO.NDIV1.TSAMP
        AM. U. FCENTER. DEV. TMOD. WEIGH)
    XJ(I3) = XJS
    TIME(I3) = TIME1
    PO 50 J5 = 1.3
    X(I3.J5) = X1(J5)
    CONTINUE
    CONTINUE
    IMIN = 0
    XJ(IMIN) = 1.D0
    FBD(IMIN) = 1.D0
    DO 60 I6 = 1.16
    IF (XJ (2 MIN)/FBD(IMIN).GE.XJ(I6)/FBD(I6)) IMIN = I6
    CONTINUE
    D0 70 I7 = 1.16
    TIME(I1) = TIME (IMIN)
    DO 80 J8 = 1.3
    X(I).J81 = X(IMIN).J8
    CONTINUE
    CONTINUE
    WRITE (10.100) I.TIME (IMIN.NDIV(IMIN).X(IMIN.2)*GVCO
    IF (I.GE.750. AND. I.LE.901 WRITE (9.*) NDIV(IMIN)
    FORMAT (1X, I8.2X, E13.6, 2X, I8, 2X, E13.6)
    XJITTER = (11.D0/(X(IMIN.2)*GVCO) -1.D0/FSAMPLE)/FBD(I)
    XI = (XMODT*FCENTER*DEV+FCENTER)*FBDM/GVCO
    CALL XMODF (XMODT, TIME(IMIN), WEIGH, TMOD, FBDM)
    WRITE (12,110) I, TIME(IMIN), X(IMIN, 2), X2, X(IMIN.2) -X1,
    XJITTER
    FORMAT (I4, 2X, 5(1X, E13.6))
    FSAMPLE = X(IMIN.2)*GVCO
    TSAMP*1.D0/FSAMPLE
    XMAX(I) = FSAMPLE
    DO 160 I8 = 1.8
    IF (I.GF. 150*I3. AND. I.L'E. 150*(I3+1))
    ERR(I3) = ERR(IE)+ABS(IMIN.2) = XI)
    CONTINUE
    CONTINUE
    DO 120 I12 = 1.8
    WRITE (12, *)' '
    WRITE (12, 130) I12, ERR(I12)
    DO 140 I14 = I12*150. (I12+1)*150 -1
    IF(XMAX(I16), GE, 133, 1D6) WRITE (12, 150)
    CONTINUE
    FORMAT (7X, 'NUMBER OF CYCLE =', I4, 2X, 'FREQUENCY
        HIGHER THAN 133.31 MHZ = ', E13.6)
    CONTINUE
    SUBROUTINE XMODEL (X, XJS, DELT, FBDM, GVCO,
    NDIV, 75
    AMP
        AM, U, FCENTER, DEV, TMOD, WEIGH)
    IMPLICIT DOUBLEPRECISION (A–H, O–Z)
    DIMENSION AM(3.3), X(3), XN(3), TEMP1(3), TEMP2(3), U(3)
    DO 90 I9 = 1.NDIV
    DELT = DELT+TSAMP
    CALL GMAXVEC (XN, AM, X)
    CALL VECXCOM (TEMP1, XN, TSAMP)
    CALL VECADD (TEMP2, TEMP1, X)
    CALL VECXCON TEMP1, U, TSAMP)
    CALL VECADD (XN, TEMP1, TEMP2)
    CALL VECEQU (X, XN)
    CALL XMODE (SMODT, DELT, WEIGH, TMOD)
    XJ = (XN(2)-(XMODT*FCENTER*DEV+FCENTER)*FBDM/GVC
    XJS = XJS+XJ
    CONTINUE
    RETURN
    END
SUBROUTINE XMODF (XMODT, T, WEIGH, PERIOD)
    IMPLICIT DOUBLEPRECISION (A–H, O–Z)
    TS = 4,D0* (T/PERIOD = DINT (T/PERIOD))
    JI (75/4.D0, LT, P.5) THEN
    XMODT = WEIGH*(TS=1.D0)+(1.D0–WEIGH)*(TS–1.D0)**7.80
    ELSE
    XMODT = WEIGH*(3.D0–TS)+1.D0–WEIGH)*(3.D0–TS)**3.DO
    ENDIF
    RETURN
    END
SUBROUTINE GMAXVEC (A, B, C)
                        [ ]3x3 [ ] 3x1 [ ] 3x1
    IMPLICIT DOUBLEPRECISION (A–H, O–Z)
    DIMENSION A(3), b(3,3), C(8)
    DO 200 I20 = 1,3
    SUM = 0.D0
    CONTINUE
    A(I20) = SUM
    RETURN
    END
SUBROUTINE VE'CXCON (A,B,C)
    IMPLICIT DOUBLEPRECISION (A–H, O–Z)
    DIMENSION (*), R(3)
    DO 220 I22 = 1,3
    A(I22) = B(I22)*C
    CONTINUE
    RETURN
    END
SUBROUTINE VECADD (A,B,C)
    IMPLICIT DOUBLEPRECISION (A–H, O–Z)
    DIMENSION A(3), B(3), C(3)
    DO 230 I23 = 1, 3
    A(I23) = B(I23+C(I23)
    CONTINUE
    RETURN
    END
SUBROUTINE VECEQU (A,B)
    IMPLICIT DOUBLEPRECISION (A–H, O–Z)
    DIMENSION A(3), B(3)
                        [A]3x1 = [B]3x1
    DO 240 I24 =1.3
    A(I24 = B(I24)
    CONTINUE
    RETURN
    END
```

What is claimed is:

1. A clock generation circuit comprising:

a voltage controlled oscillator circuit for receiving a voltage signal;

a charge pump circuit for producing current;

a phase detector for receiving an input clock signal and providing the charge pump with an error signal;

a summation node for providing an input clock signal to the phase detector;

a low pass filter circuit connected to an output of the charge pump circuit for translating an input current into a voltage;

a programmable feedback divider circuit for dividing a voltage controlled oscillator frequency and injecting a modulation frequency; and a memory for storing spread spectrum values for controlling a spread spectrum modulation of output divided signals produced by said programmable feedback divider circuit.

2. The clock generation circuit according to claim 1, including an indexing circuit in said programmable feedback divider circuit for symmetrically sweep modulating the output divided signals.

3. The clock generation circuit according to claim 2 wherein said indexing circuit is a feedback circuit.

4. The clock generation circuit according to claim 2 wherein the indexing circuit is connected to the output of said programmable feedback divider circuit.

5. The clock generation circuit according to claim 1, including a counter configured to count the output divided signals and reset to zero at regular intervals.

6. The clock generation circuit according to claim 1, wherein said memory stores 4-bit values for modulation of said output divided signals.

7. The clock generation circuit according to claim 1, wherein said memory is a read only memory.

8. The clock generation circuit according to claim 1, wherein said memory contains spread spectrum values for a spread spectrum modulation waveform to reduce jitter.

9. The clock generation circuit according to claim 1, including an adder for setting a base number to be provided to said programmable feedback divider circuit to establish a base frequency divider number with respect to which modulation occurs.

10. A clock generation circuit comprising:

a voltage controlled oscillator circuit for receiving a voltage signal;

a charge pump circuit for producing current;

a phase detector for receiving an input clock signal and providing the charge pump with an error signal;

a summation node for providing an input clock signal to the phase detector;

a low pass filter circuit connected to an output of the charge pump circuit for translating an input current into a voltage;

a programmable feedback divider circuit for dividing a voltage controlled oscillator frequency and injecting a modulation frequency; and a memory for storing predetermined values for controlling spread spectrum modulation of output divided signals produced by said programmable feedback divider circuit.

11. The clock generation circuit according to claim 10, including an indexing circuit in said programmable feedback divider circuit for symmetrically sweep modulating the output divided signals.

12. The clock generation circuit according to claim 11, wherein said indexing circuit comprises a secondary feedback loop.

13. The clock generation circuit according to claim 11, wherein the indexing circuit is connected to the output of said programmable feedback divider circuit.

14. The clock generation circuit according to claim 10, including a counter configured to count the output divided signals and reset to zero at regular intervals.

15. The clock generation circuit according to claim 14, wherein said counter is configured to address said memory.

16. The clock generation circuit according to claim 10, wherein said memory stores 4-bit values for modulation of said output divided signals.

17. The clock generation circuit according to claim 10, wherein said memory comprises a read only memory.

18. The clock generation circuit according to claim 10, wherein said predetermined values determine a spread spectrum modulation waveform.

19. The clock generation circuit according to claim 10, including an adder for setting a base number to be provided to said programmable feedback divider circuit to establish a base frequency divider number with respect to which modulation occurs.

20. The clock generation circuit according to claim 19, wherein said adder is configured to add said predetermined values to said base number to control said modulation of said output divided signals.

* * * * *